US006875681B1

(12) United States Patent
Bohr (10) Patent No.: US 6,875,681 B1
(45) Date of Patent: Apr. 5, 2005

(54) WAFER PASSIVATION STRUCTURE AND METHOD OF FABRICATION

(75) Inventor: Mark T. Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/002,178

(22) Filed: Dec. 31, 1997

(51) Int. Cl.$^7$ ............................................. H01L 21/44
(52) U.S. Cl. ...................... 438/612; 438/613; 438/614; 438/624; 438/627; 438/637; 438/958
(58) Field of Search ................................ 438/612, 613, 438/614, 624, 627, 637, 648, 782, 958; 257/751, 737, 738

(56) References Cited

U.S. PATENT DOCUMENTS

| | | | | |
|---|---|---|---|---|
| 4,921,810 A | * | 5/1990 | Kunieda et al. ............... 438/15 |
| 4,927,505 A | * | 5/1990 | Sharma et al. .............. 205/123 |
| 5,023,205 A | * | 6/1991 | Reche .......................... 216/18 |
| 5,136,364 A | * | 8/1992 | Byrne .......................... 257/751 |
| 5,260,600 A | * | 11/1993 | Harada ....................... 257/639 |
| 5,354,695 A | | 10/1994 | Leedy |
| 5,369,299 A | * | 11/1994 | Byrne .......................... 257/638 |
| 5,559,056 A | | 9/1996 | Weiler |
| 5,563,102 A | * | 10/1996 | Michael ....................... 438/614 |
| 5,565,384 A | * | 10/1996 | Havemann ................... 438/702 |
| 5,587,336 A | | 12/1996 | Wang et al. |
| 5,612,254 A | * | 3/1997 | Mu et al. ..................... 438/634 |
| 5,661,082 A | * | 8/1997 | Hsu et al. .................... 438/612 |
| 5,677,239 A | * | 10/1997 | Isobe .......................... 438/633 |
| 5,693,565 A | * | 12/1997 | Camilletti et al. ............. 438/17 |
| 5,698,456 A | * | 12/1997 | Bryant et al. ................... 438/6 |
| 5,759,906 A | * | 6/1998 | Lou ............................ 438/623 |
| 5,767,010 A | * | 6/1998 | Mis et al. .................... 438/614 |
| 5,883,001 A | * | 3/1999 | Jin et al. ..................... 438/624 |
| 5,900,668 A | * | 5/1999 | Wollesen ..................... 257/522 |
| 5,989,992 A | * | 11/1999 | Yabu et al. .................. 438/612 |
| 6,025,275 A | * | 2/2000 | Efland et al. ................ 438/722 |
| 6,143,638 A | * | 11/2000 | Bohr ........................... 438/612 |
| 6,204,074 B1 | * | 3/2001 | Bertolet et al. ................ 438/18 |

* cited by examiner

Primary Examiner—Maria F. Guerrero
(74) Attorney, Agent, or Firm—George Chen (57) ABSTRACT

A wafer passivation structure and its method of fabrication is described. According to one embodiment of the present invention a metal layer having a bond pad spaced by a gap from a metal member is formed on a substrate. A first dielectric layer is then formed over the bond pad and the metal member and completely fills the gap. Next a second dielectric layer, having a dielectric constant greater than the first dielectric layer and being hermetic is formed over the first dielectric layer. In another embodiment of the present invention a first dielectric layer is formed on the top surface of a bond pad of a substrate. A second dielectric layer is then formed on the first dielectric. An opening is then formed through the first and second dielectric layers so as to expose the top surface of the bond pad. A barrier layer is then deposited on the sides of the opening and on the top surface of the bond pad. A contact is then formed on the barrier layer in the opening.

17 Claims, 9 Drawing Sheets

WAFER PASSIVATION STRUCTURE AND METHOD OF FABRICATION

BACKGROUND OF THE INVENTION

1. Field of the Invention

The present invention relates to the field of semiconductor integrated circuit manufacturing, and more specifically to a passivation structure and its method of fabrication.

2. Discussion of Related Art

Integrated circuits are made up of literally millions of individual devices such as transistors and capacitors formed on a semiconductor substrate. The devices are integrated together by alternating conductive and insulating layers to form functional circuits such as microprocessors. The final layer deposited is typically a passivation layer which is an insulating layer which provides protection against mechanical and chemical damage during assembly and packaging.

Figure 1:
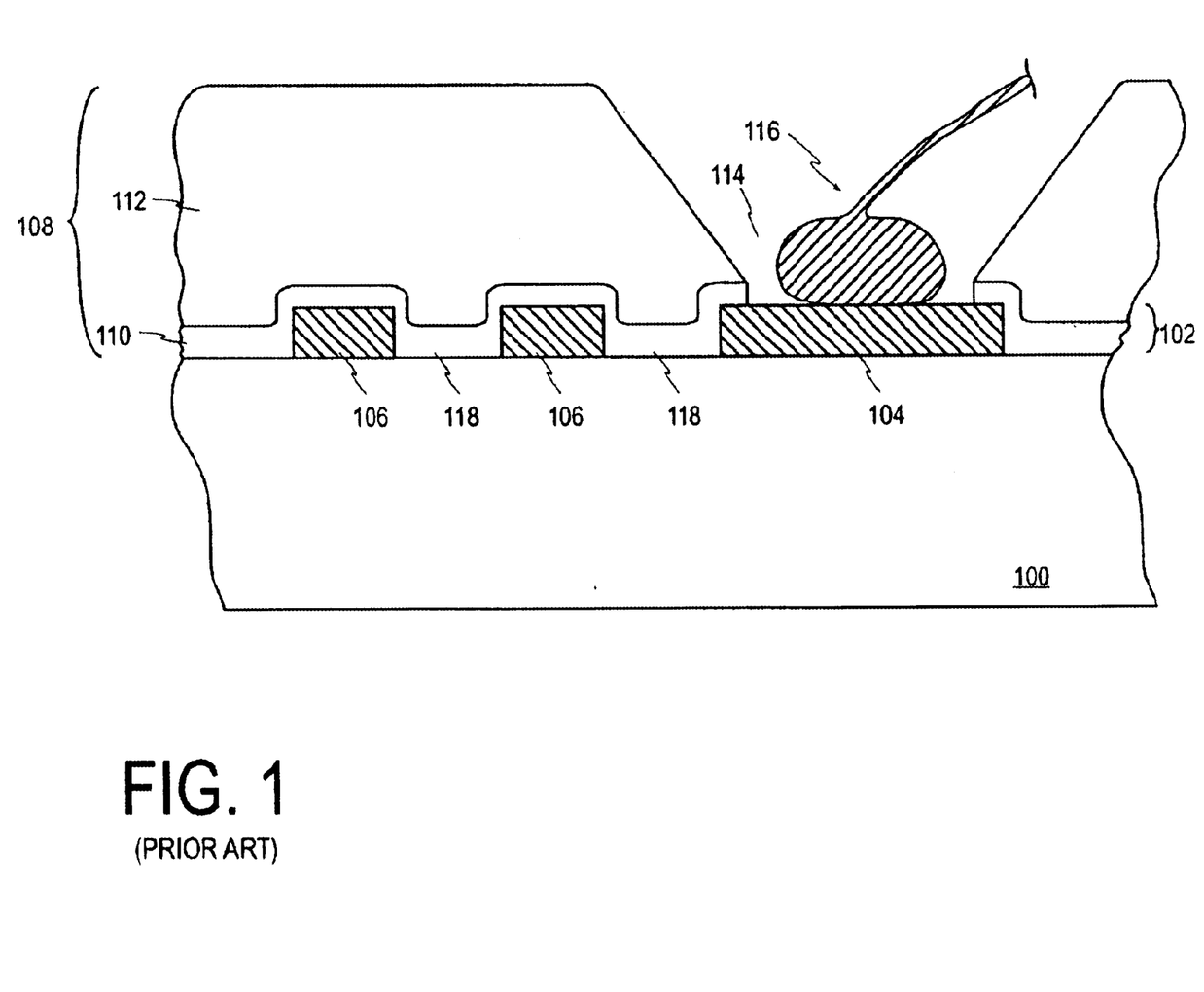
FIG. 1 is an illustration of a conventional passivation structure.

An example of a conventional passivation structure is shown in FIG. 1. FIG. 1 shows a substrate 100 having formed on its outer surface a metal interconnect layer 102 which includes a bond pad 104 and interconnects 106. A passivation layer 108 which includes a silicon nitride layer 110 and a thick polyimide layer 112 is formed over metal layer 102 as shown in FIG. 1. A contact opening 114 is then formed through the silicon nitride layer 110 and the polyimide layer 112 to enable an electrical contact, such as a wire bond 116, to be made to bond pad 104 to enable the inputting and outputting of external signals to the substrate. Silicon nitride layer 110, which is a hermetic layer, is formed in direct contact with the lower metal layer 102 to ensure that no moisture path exists to the underlying substrate, especially in the bond pad openings 114.

Although such a passivation structure provides an excellent hermetic seal of substrate 100, device performance suffers due to high metal line-to-metal-line capacitance. That is, because silicon nitride layer 110 has a high dielectric constant (approximately 7.0) and because it is formed in gaps 118 between adjacent metal features 104 and 106, line-to-line capacitive coupling is increased and device performance reduced. Another problem associated with the passivation structure shown in FIG. 1 is that it is difficult to deposit a silicon nitride layer into high aspect ratio gaps 118 to a thickness necessary to obtain a sufficient hermetic seal.

Thus what is desired is a passivation structure and methodology which forms a hermetic seal and which provides low interconnect capacitance.

SUMMARY OF THE INVENTION

A wafer passivation structure and its method of fabrication is described. According to one embodiment of the present invention a metal layer having a bond pad spaced by a gap from a metal member is formed on a substrate. A first dielectric layer is then formed over the bond pad and the metal member and completely fills the gap. Next a second dielectric layer, which is hermetic and which has a dielectric constant greater than the first dielectric layer, is formed over the first dielectric layer.

In another embodiment of the present invention a first dielectric layer is formed on the top surface of a bond pad of a substrate. A second dielectric layer is then formed on the first dielectric. An opening is then formed through the first and second dielectric layers so as to expose the top surface of the bond pad. A barrier layer is then deposited on the sides of the opening and on the top surface of the bond pad. A contact is then formed on the barrier layer in the opening.

BRIEF DESCRIPTION OF THE DRAWINGS

FIG. 3b is an illustration of a cross-sectional view showing the formation of a first dielectric layer over the substrate of FIG. 3a.

DETAILED DESCRIPTION OF THE PRESENT INVENTION

The present invention is a hermetic, low interconnect capacitance passivation structure and its method of fabrication. In the following description numerous specific details such as materials, thicknesses and processes are set forth in order to provide a thorough understanding of the present invention. It will be obvious however to one skilled in the art that the present invention may be practiced without these specific details. In other instances well known semiconductor processes and equipment have not been explained in detail in order to not unnecessarily obscure the present invention.

Figure 2:
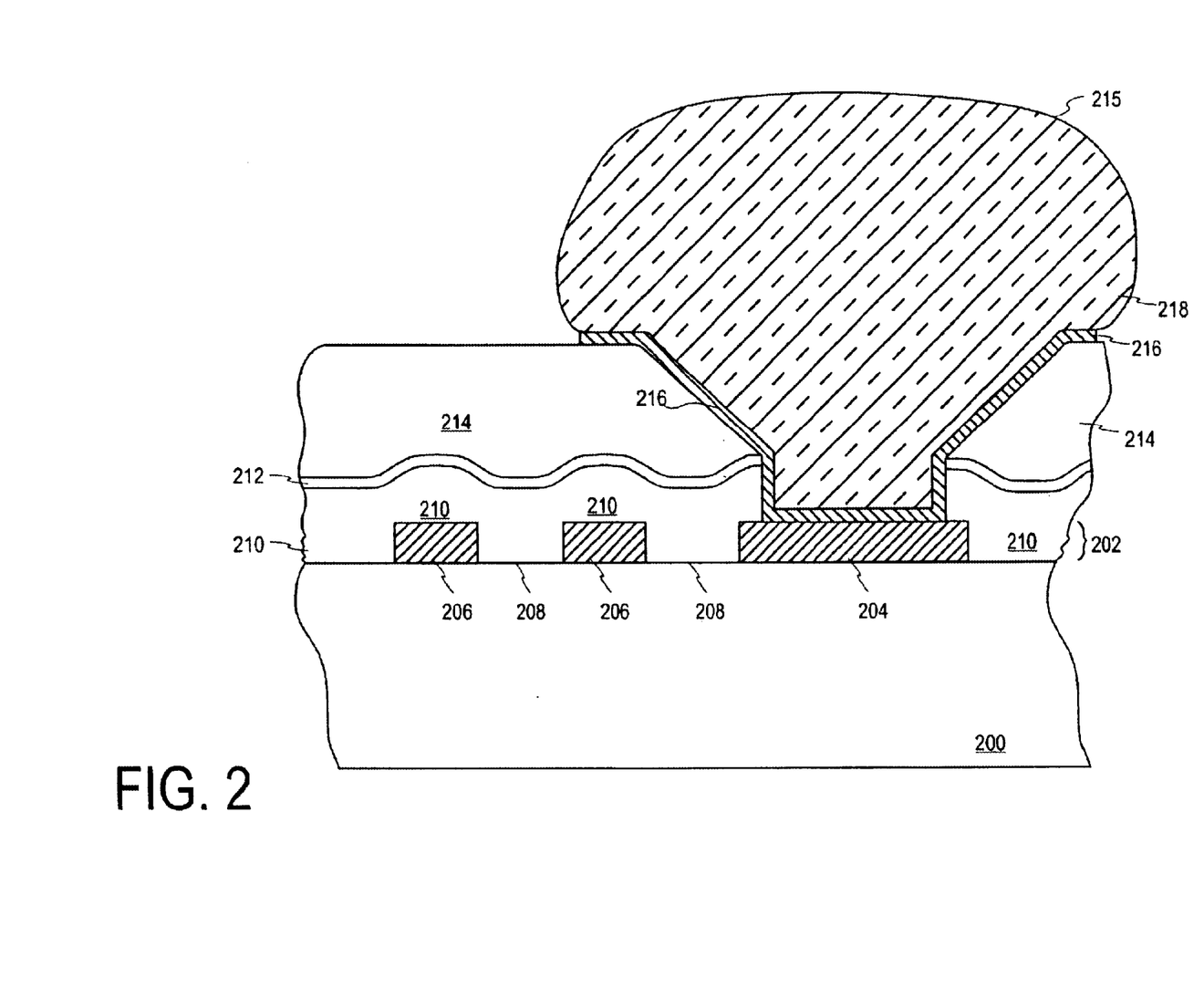
FIG. 2 is an illustration of a cross-sectional view of a hermetic low capacitance passivation structure of the present invention.

The present invention is a hermetic, low interconnect capacitance passivation structure and its method of fabrication. A passivation structure in accordance with the present invention is shown in FIG. 2. Formed on a substrate 200 is an outer level of metalization which includes metal features such as bond pads 204 and interconnects 206 which are separated by gaps 208. A first dielectric layer 210 is formed over bond pads 204 and metal features 206 and to a thickness to completely fill gaps 208. The first dielectric layer 210 is preferably formed of a material which has a relatively low dielectric constant (less than 4.0) such as silicon dioxide. A sealing dielectric layer 212 formed of a moisture resistance material (i.e., a hermetic material), such as silicon nitride, is formed over the first dielectric layer 210. A capping dielectric layer 214, such as a polyimide, can be formed on sealing dielectric layer 212 to provide for scratch resistance and package stress interfacing. An electrical contact 215, such as a controlled chip collapse contact (C-4) which includes a conductive barrier layer 216 and a bump 218 is formed through dielectric 210, sealing dielectric 212, and capping dielectric 214 and makes electrical contact with bond pad 204.

Sealing dielectric layer 212 and barrier layer 216 combine to form a hermetic seal of substrate 200. Because barrier layer 216 and sealing layer 212 provide the hermetic seal for substrate 200 first dielectric layer 210 can be formed of a material which has a low dielectric constant but which is not resistant to moisture penetration. By completely filling gaps 208 with a low dielectric constant material 210, there is low interconnect capacitance (low capacitive coupling) between adjacent metal features, which results in improved (faster) device performance. In this way the present invention provides a passivation structure which is both hermetic (resistance to moisture penetration) and which exhibits extremely low capacitance.

Figure 3A:
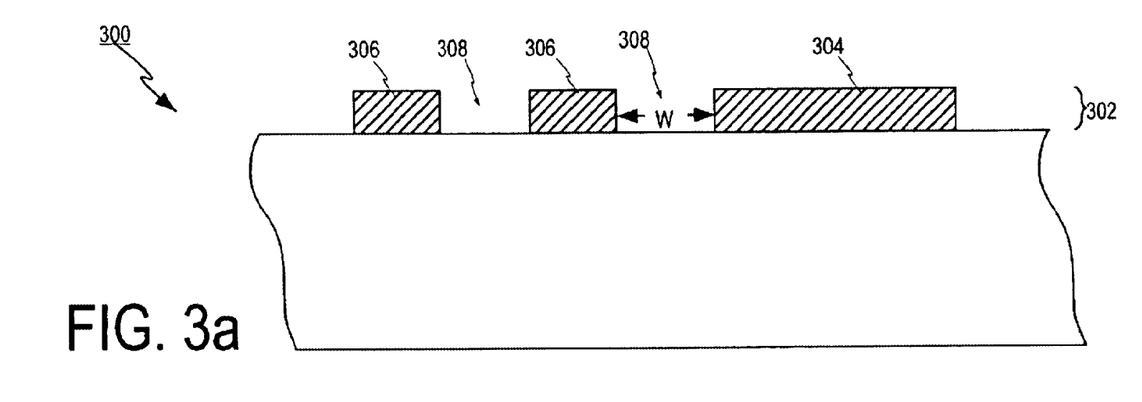
FIG. 3a is an illustration of a cross-sectional view of a substrate having an outer most metalization layer including a bond pad.

FIGS. 3a–3g illustrate a method of fabricating a passivation structure in accordance with the present invention. According to the present invention, a substrate 300 such as shown in FIG. 3a, is provided. Substrate 300 includes on its outer surface a metalization layer 302 which includes at least one bond pad 304 (and typically several hundred) for inputting and outputting data to and from substrate 300. The outer metalization layer 302 also includes metal features 306 such as interconnects and capacitor electrodes. The metalization layer 302 is formed from a low resistance metal or metal alloy such as but not limited to copper, aluminum, and gold and has a total thickness of between 5,000Å–30,000Å. The metalization layer 302 may or may not include barrier layers and anti reflective coatings. The individual metal features of metalization layer 302 are separated by gaps 308. The minimum spacing or width (w) of gaps 308 is defined by the critical dimensions of the process which in the present invention can be less than 0.30μm. Such narrow feature spacing can create high aspect ratio gaps 308 (i.e., gaps with aspect ratio around 2.0). Aspect ratio is defined as the gap height over the gap width.

Additionally, as is well known in the art, substrate 300 typically includes a silicon substrate, devices such as transistors and capacitors, and multiple layers of metal and insulators used to couple devices into functional circuits. It is to be appreciated that substrate 300 need not necessarily be a semiconductor substrate used to fabricate integrated circuits but may be any type of substrate such as those used in flat panel displays. For the purposes of the present invention a substrate is defined as a material on which films of the present invention are formed and on which processes of the present invention act.

Figure 3B:
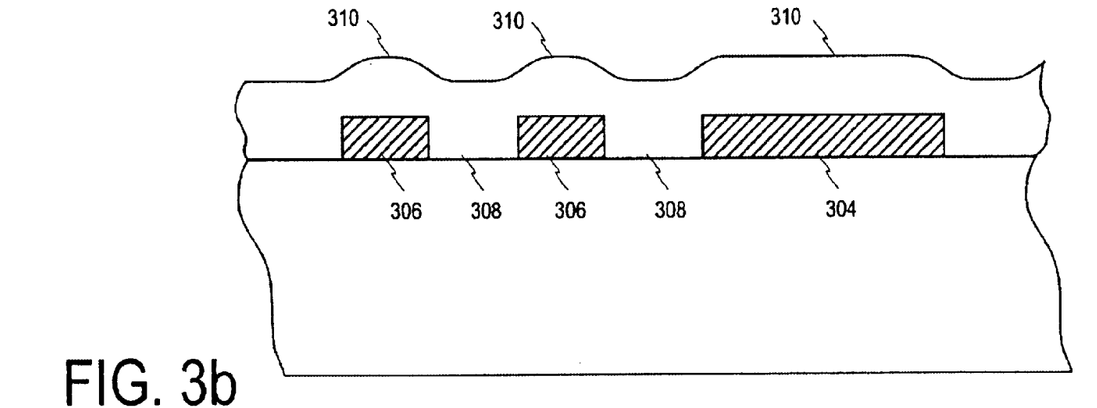

The first step of the present invention is to form a first dielectric layer 310 over substrate 300 as shown in FIG. 3b. Dielectric layer 310 is deposited over bond pads 304 and metal features 306 and in such a manner so as to completely fill gaps 308. Dielectric layer 310 is formed to at least a minimum thickness which is sufficient to completely fill gaps 308. In most cases, dielectric layer 310 is deposited to a thickness at least as thick as metal 302 which ensures complete filling of the widest gaps.

Dielectric layer 310 is preferably formed of a material which has a dielectric constant at least as low as silicon dioxide (i.e., a dielectric constant less than 4.0). In one embodiment of the present invention dielectric layer 310 is a silicon dioxide ($SiO_2$) film formed by high density plasma (HDP) utilizing a chemistry comprising $SiH_4$ and $O_2$ with a substrate temperature of between 350–400° C. Such a process provides excellent gap filling which enables the filling of high aspect ratio gaps 308 and provides a smooth surface on which subsequent layers can be deposited. First dielectric layer 310 can be doped with fluorine ions in order to further reduce the dielectric constant of the film. Dielectric layer 310 can be doped insitu (during the deposition of film 310) or after formation by ion implantation. It is to be appreciated that low K dielectric films such as but not limited to aerogels, polyimides, spin-on-glasses, can be used as dielectric layer 310. Additionally dielectric layer 310 need not necessarily be a single layer dielectric film but may be a composite film made of several different dielectric layers.

Figure 3C:
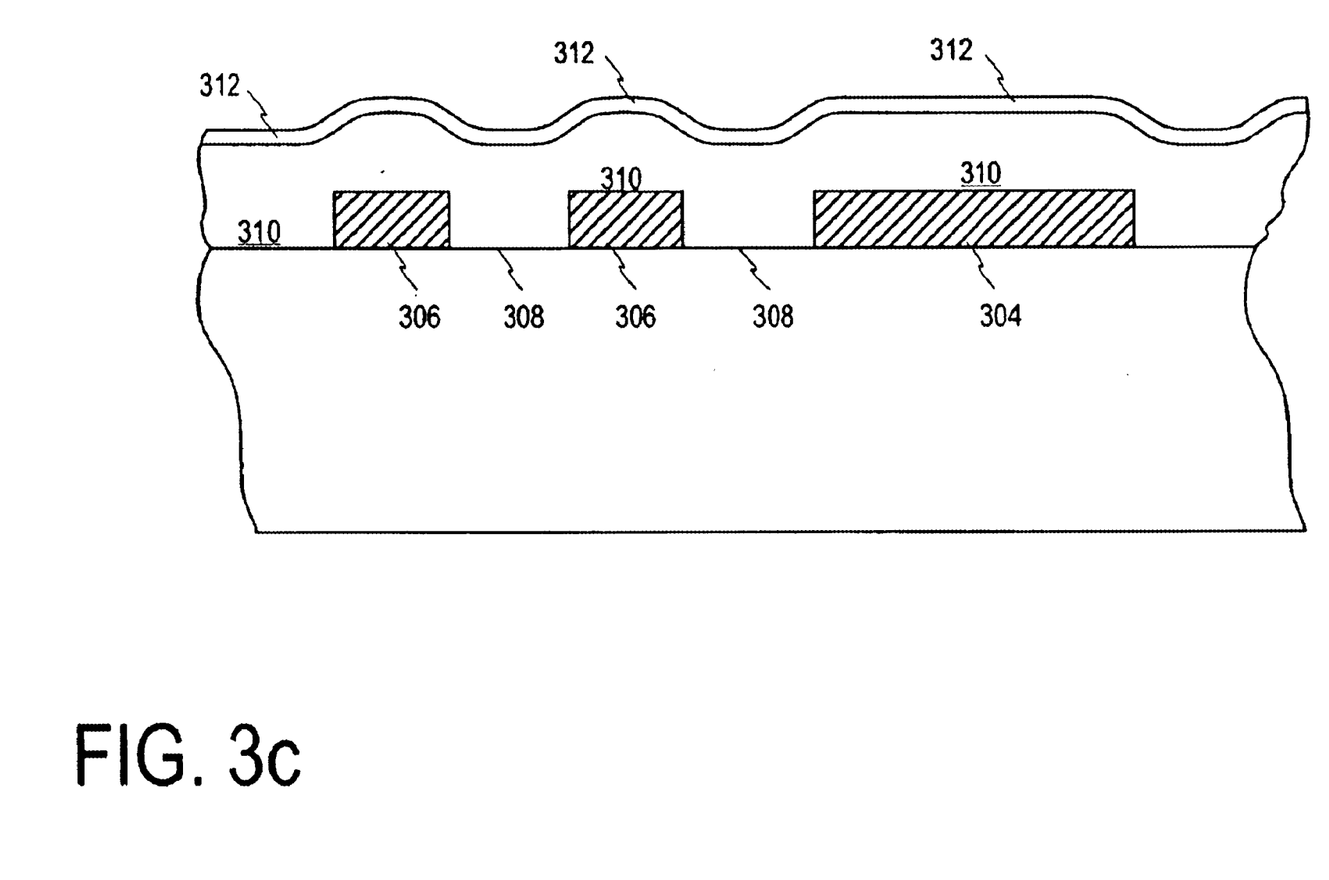
FIG. 3c is an illustration of a cross-sectional view showing the formation of a sealing dielectric layer over the substrate of FIG. 3b.

Next, as shown in FIG. 3c, a sealing dielectric layer 312 is formed over first dielectric layer 310. Sealing dielectric layer 312 is formed of a material which is resistant to moisture penetration (i.e., formed of a hermetic material). A layer is said to be hermetic if it can prevent moisture penetration under humid ambients at normal chip operating temperatures, generally between 100–120° C. Sealing dielectric layer 312 is formed as thin as possible while still providing a suitable hermetic seal. In one embodiment of the present invention sealing dielectric layer 312 is a silicon nitride film formed to a thickness between 500–1,500Å by plasma enhanced CVD utilizing a chemistry comprising SiH4 and NH3 and a substrate temperature of 400° C. When a plasma enhanced CVD silicon nitride layer 312 is deposited onto a HDP formed silicon dioxide layer, silicon nitride layer 312 can be formed thin (less than 1,000Å) and yet still provide a hermetic seal due to the smooth surface of the HDP silicon dioxide film.

It is to be appreciated that because hermetic dielectric layers, such as silicon nitride, have high dielectric constants, it is important to keep sealing dielectric layer 312 above metal features 304 and 306 and out of gaps 308 so that its high dielectric constant does not increase the capacitive coupling between adjacent metal features, and thereby decrease device performance.

Figure 3D:
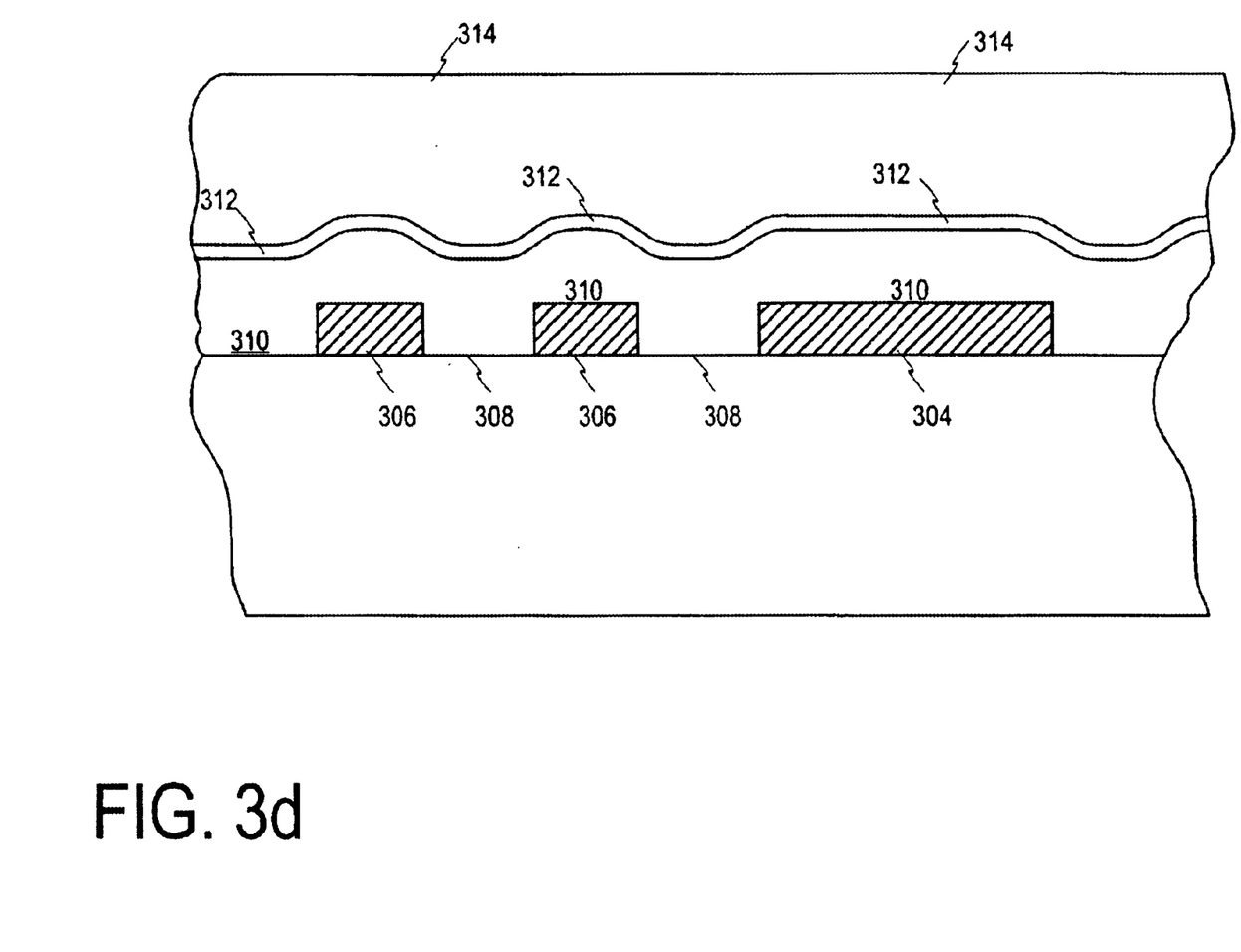
FIG. 3d is an illustration of a cross-sectional view showing the formation of a capping dielectric over the substrate of FIG. 3c.

Next, as shown in FIG. 3d, a capping dielectric layer 314 is formed over sealing dielectric layer 312. Capping dielectric layer 314 provides stress relief between the package and substrate 300 and also provides scratch protection for sealing dielectric 312 so that scratches cannot affect the integrity of the hermetic seal formed by sealing dielectric layer 312. In one embodiment of the present invention capping dielectric layer 314 is a photodefinable polyimide such as Hitachi photodefinable polyimide type 1708. Such a polyimide can be "spun-on", as is well known in the art, to a thickness of between 2.0–10 microns. Alternatively capping layer 314 can be for example a CVD deposited silicon dioxide layer.

Figure 3E:
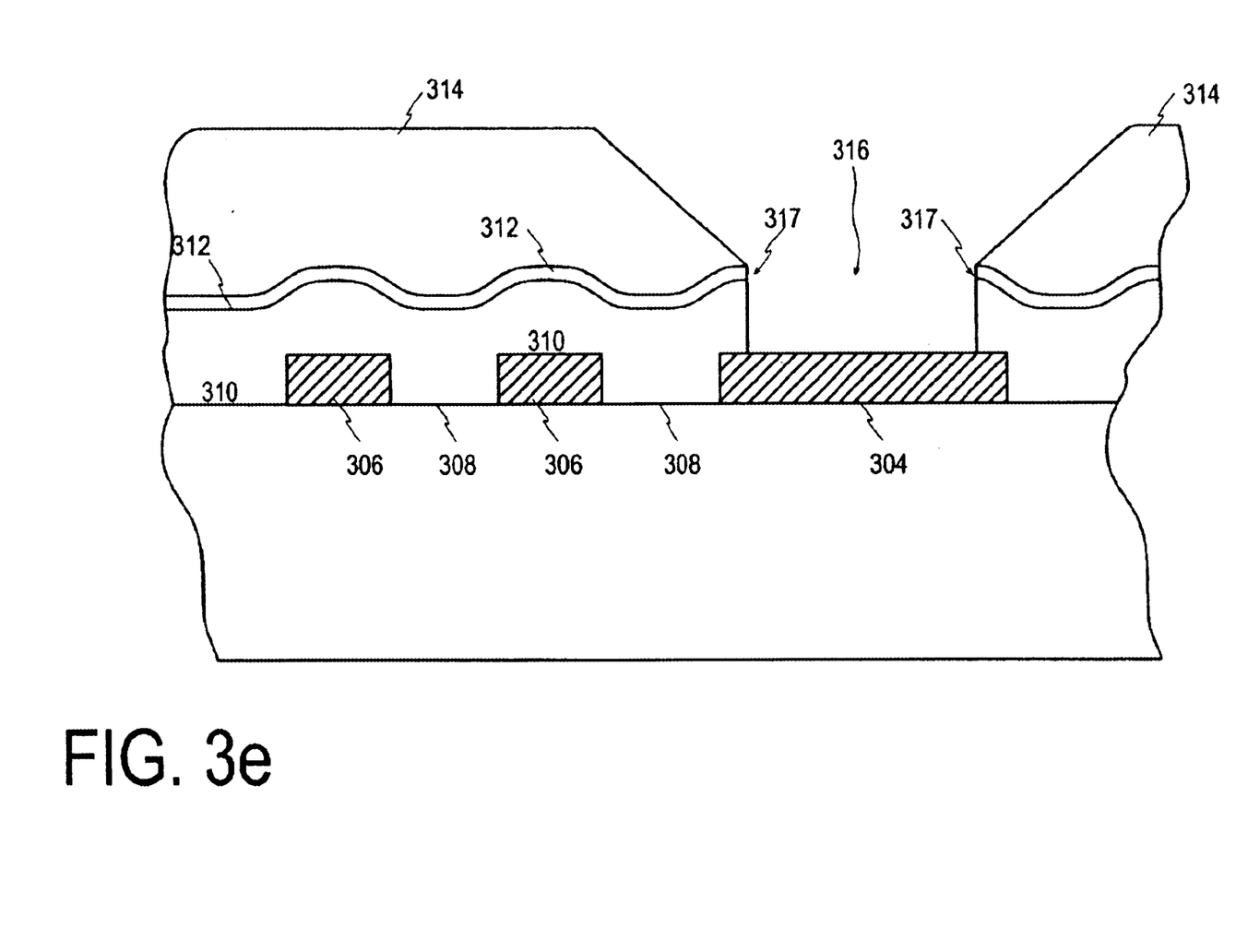
FIG. 3e is an illustration of a cross-sectional view showing the formation of a bond pad opening in the substrate of FIG. 3d.

Next, a bond pad opening 316 is formed through dielectric layers 314, 312, and 310 down to bond pad 304 as shown in FIG. 3e. If dielectric layer 314 is a photodefinable polyimide, then opening 316 can be defined in dielectric layer 314 by masking and exposing and then developing away the light exposed portion of the capping dielectric layer 314 where the bond pad opening 316 is desired. Such a process creates tapered sidewalls in capping layer 314 which enhances subsequent film deposition in opening 316. Patterned capping dielectric layer 314 can be used as a mask for etching of sealing dielectric layer 312 and dielectric layer 310. If sealing dielectric layer 312 is a silicon nitride layer it can be anisotropically etched by reactive ion etching (RIE) with a chemistry comprising: $SF_6$ and He in a well known LAM etcher. Once sealing dielectric layer 312 has been etched through, the etch chemistry can be changed to a suitable chemistry which etches first dielectric 310 which, in the case of silicon dioxide, can be $C_4F_8+CO$. The etching of dielectric layer 310 can be a timed etch which provides over etching to ensure complete removal of dielectric layer 310 from bond pad 304 in bond pad opening 316.

If dielectric layer 314 is not a photodefinable material, then a standard photoresist mask can be formed over dielectric layer 314 and patterned by well known photolithography techniques.

Figure 3F:
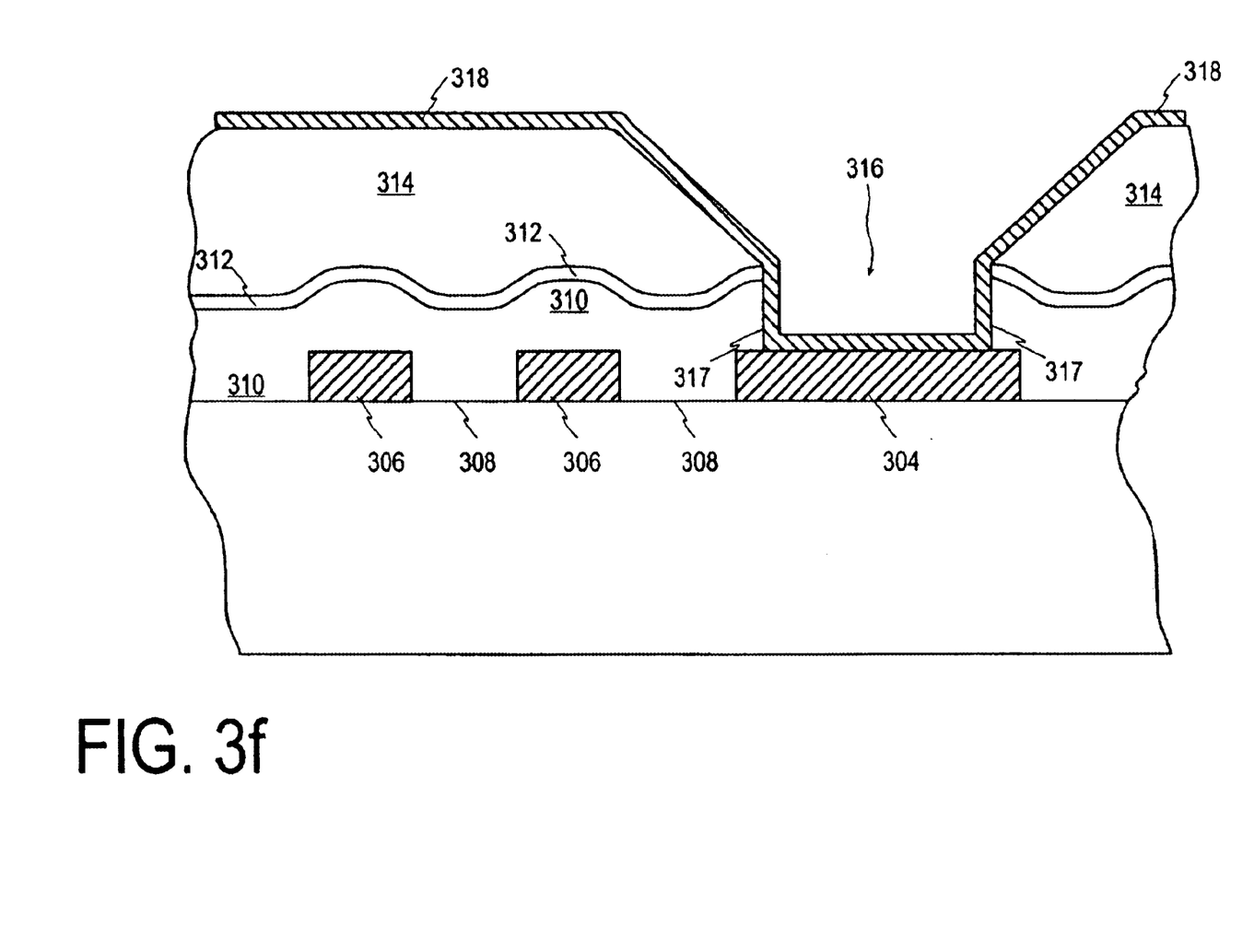
FIG. 3f is an illustration of a cross-sectional view showing the formation of a conductive barrier layer on the substrate of FIG. 3e.

Next, as shown in FIG. 3f, a conducting barrier layer 318 is formed over substrate 300 as shown in FIG. 3f. Barrier layer 318 is formed over the top surface of capping dielectric layer 314, along the sidewalls 317 of bond pad opening 316 and over bond pad 304. Barrier layer 318 forms a hermetic seal along sidewalls 317 of contact opening 316. Barrier layer 318 is formed of a material and to a thickness which is sufficient to prevent moisture from penetrating through barrier layer 318 and into dielectric layer 310.

In one embodiment of the present invention, barrier layer 318 is a barrier layer used for a controlled chip collapse contact (C-4) gold plated bump. A barrier layer for a C-4 bump can be formed by sputter depositing a dual layer film comprising a lower 500Å thick titanium film and an upper 4,000Å thick nickel vanadium film. The titanium film acts as a barrier against gold diffusion while nickel vanadium film helps the C-4 bump adhere to bond pad 304. In another embodiment, barrier layer 318 can be a barrier layer used for a tape automated bonding (TAB) contact. A TAB barrier layer can be formed by sputter depositing a dual layer film comprising a lower titanium film and an upper gold film. The titanium layer acts as a barrier against gold diffusion while the gold layer helps a gold TAB bump adhere to bond pad 304. An argon sputter etch can be used prior to and insitu with the formation of barrier layer 318 to provide a clean low resistance contact with bond pad 304.

Figure 3G:
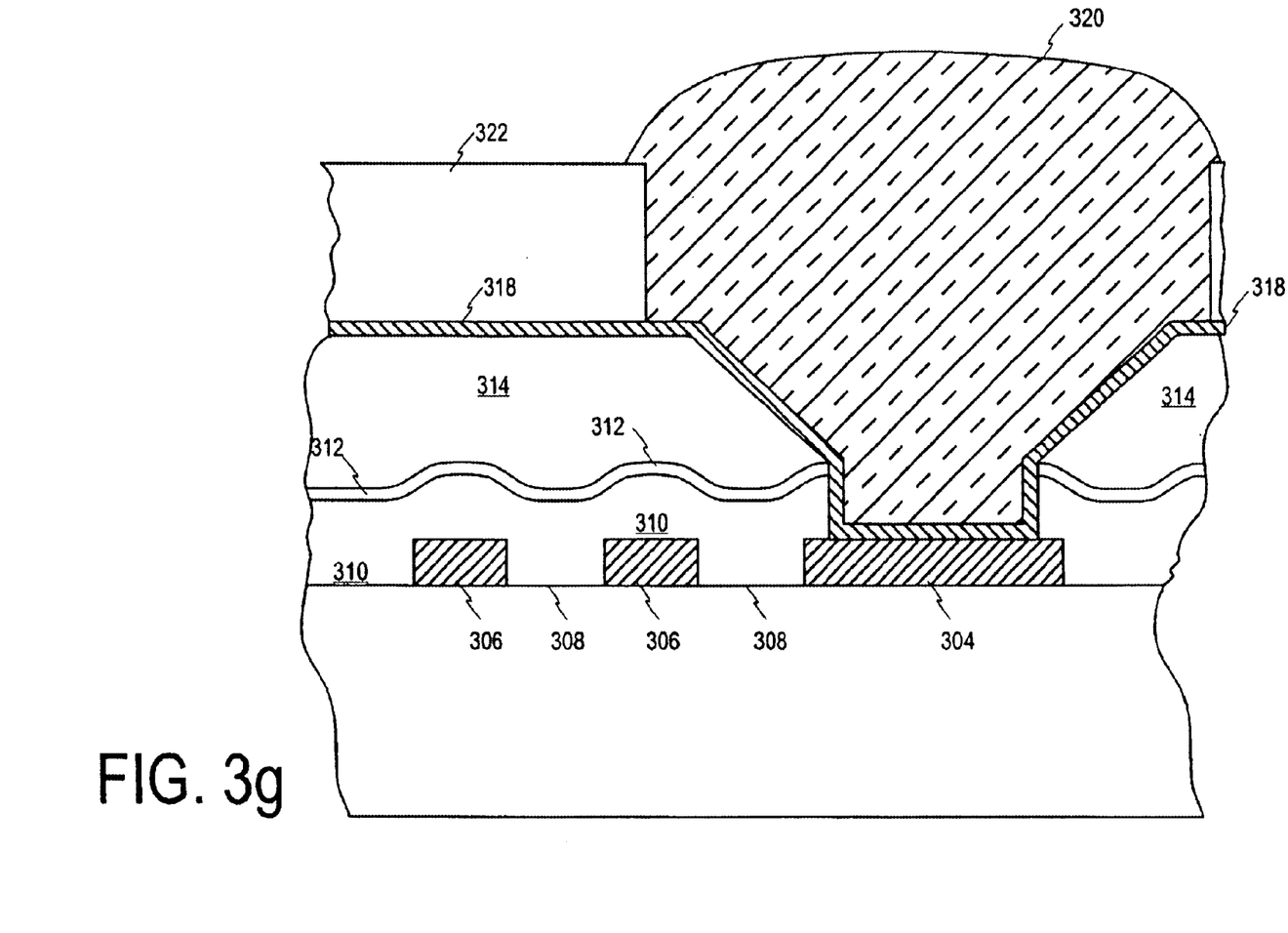
FIG. 3g is an illustration of a cross-sectional view showing the formation of a bump on the substrate of FIG. 3f.

Next, a bump 320 is formed on barrier layer 318 as shown in FIG. 3g. In one embodiment of the present invention bump 320 is a C-4 solder bump. A C-4 solder bump can be formed by depositing a photoresist layer 322 of approximately 25 microns onto barrier layer 318 and then patterning the photoresist layer to define locations where C-4 bumps are desired. A solder bump (PbSn) can then be formed by electroplating on those areas a barrier layer 318 not covered by photoresist 322. Solder bumps can be formed by placing substrate 300 in a solder plating solution and applying current to barrier layer 318 so that it builds up charge to attract solder. Bump 320 can be formed to a height of approximately 100 microns.

In another embodiment of the present invention bump 320 can be a gold plated bump used for tape automated bonding (TAB). A gold plated TAB bump can be formed in a process similar to formation of a solder bump with the exception that the bump is gold plated and is formed to a height of approximately 27 microns.

Figure 3H:
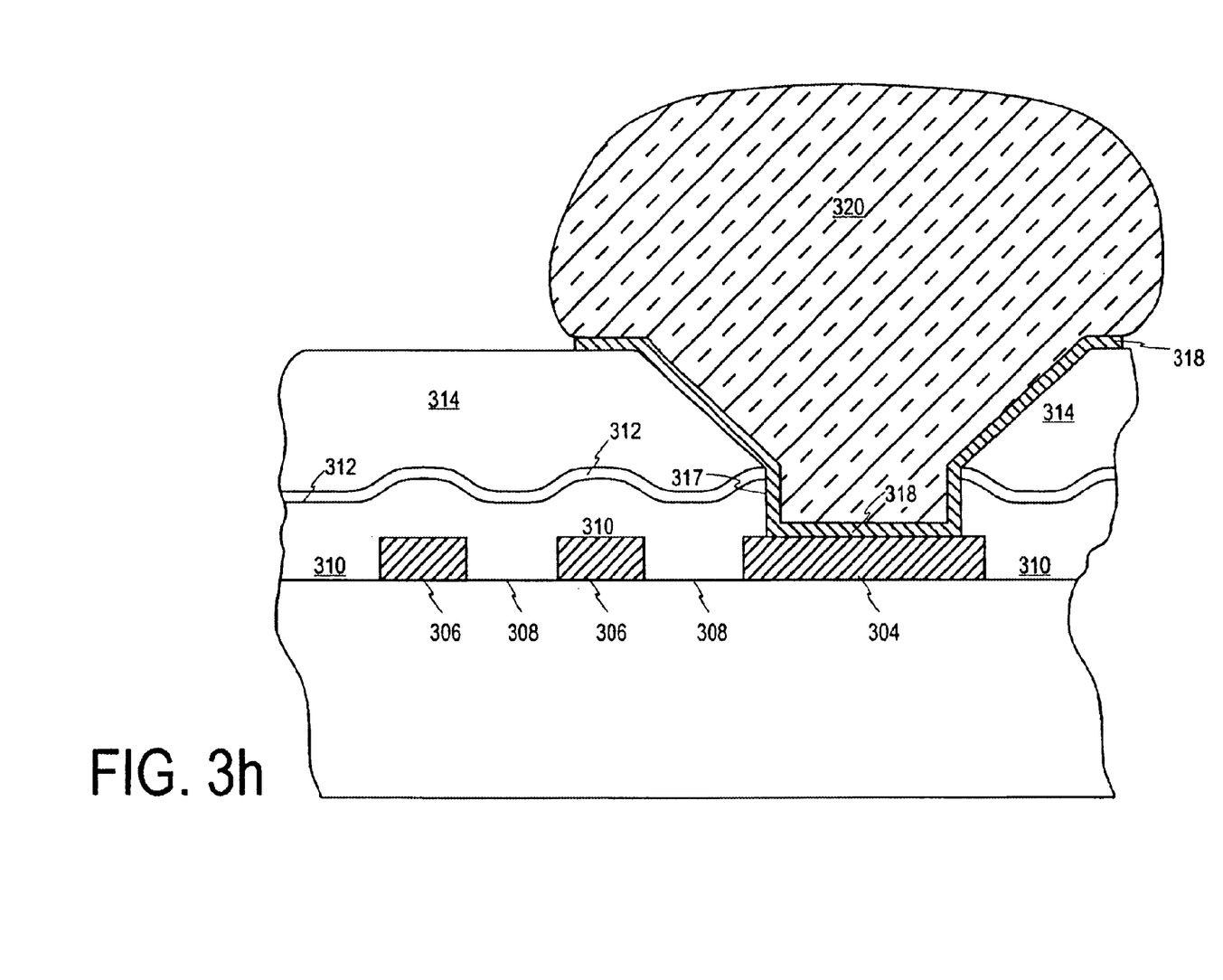
FIG. 3h is an illustration of a cross-sectional view showing the removal of a portion of the barrier layer from the substrate of FIG. 3g.

Once bump 320 has been plated to the desired thickness, photoresist layer 322 is removed by well known techniques such as by a solvent spray processor (SSP). Next the portion of barrier layer 318 not covered by bump 320 is etched away with any well known technique. A nickel vanadium layer can be etched away with a wet etchant comprising $H_2O_2$ and $H_2SO_4$ and a titanium layer can be etched away with a wet etchant comprising HF and $H_2O_2$ and $H_2SO_4$. The exposed portion of barrier layer 318 must be removed in order to prevent short circuiting of bumps 320 formed on substrate 300. If desired bump 320 can now be reflowed in order to convert the mushroom shaped bump into a rounded bump. Bump 320 can be reflowed by placing substrate 300 in a furnace having an $H_2$ ambient at 400° C. At this time the process of the present invention is complete.

The process of the present invention has formed a passivation structure which has low metal line-to-metal-line capacitance and which provides a hermetic seal of substrate 300. Line-to-line capacitance is reduced because a low dielectric constant dielectric layer 310 is formed in gaps 308 between metal lines and because high dielectric constant materials such as sealing dielectric layer 312 are kept above metal features 304 and 306 and out of gaps 308. A hermetic seal of substrate 300 is formed by sealing dielectric layer 312 and contact 322. Sealing dielectric layer 312 prevents moisture from entering through the top surface of dielectric 310 while barrier layer 318 and bump 320 coat the sidewalls 317 of bond pad openings 316 and thereby prevent moisture from entering through the exposed $SiO_2$ edges 317.

Numerous specific details have been set forth in order to provide a thorough understanding of the present invention. Those skilled in the are will appreciate the ability to substitute various equivalent materials and processes for those discussed herein. As such the detailed description of the present invention should be taken as illustrative, rather than limiting, wherein the scope of the present invention is to be measured by the appended claims which follow.

Thus, a hermetic passivation structure with low interconnect capacitance has been described.

I claim:

1. A method comprising:

providing a substrate;

forming a metal layer over said substrate, said metal layer comprising a bond pad and a first member, said bond pad and said first member being separated by a gap;

forming a first material over said bond pad and over said first member, said first material having a low dielectric constant, said first material having a thickness fill said gap;

forming a second material over said first material, said second material being thin and resistant to moisture penetration, said second material being kept above said bond pad and said first member and out of said gap;

forming a third material over said second material;

forming an opening with tapered sidewalls in said third material and vertical sidewalls in said second material and said first material to expose a top surface of said bond pad;

forming a fourth material over said third material, said tapered and vertical sidewalls of said opening, and said top surface of said bond pad, said fourth material being conductive, said fourth material having a thickness to prevent moisture penetration; and forming a bump on said fourth material over said sidewalls of said opening and over said top surface of said bond pad.

2. The method of claim 1 wherein said first material has a dielectric constant of less than 4.0.

3. The method of claim 1 wherein said first material is silicon dioxide.

4. The method of claim 1 wherein said first material is doped with fluorine atoms to reduce dielectric constant.

5. The method of claim 1 wherein said second material is hermetic.

6. The method of claim 1 wherein said third material comprises photodefinable polyimide.

7. The method of claim 1 wherein said third material has a thickness of between 2.0–10.0 microns.

8. The method of claim 1 wherein said third material comprises CVD deposited silicon dioxide.

9. The method of claim 1 wherein said third material provides stress relief.

10. The method of claim 1 wherein said third material provides scratch protection for said second material.

11. The method of claim 1 wherein said fourth material comprises a barrier layer.

12. The method of claim 1 wherein said fourth material comprises a dual layer film.

13. The method of claim 1 wherein said fourth material comprises a lower titanium film and an upper nickel vanadium film.

14. The method of claim 1 wherein said gap has a high aspect ratio.

15. The method of claim 1 wherein said second material is silicon nitride.

16. The method of claim 14 wherein said high aspect ratio is around 2.0.

17. The method of claim 15 wherein said silicon nitride has a thickness of between 500–1,500 Angstroms.

* * * * *